(12) United States Patent
Weltmann et al.

(10) Patent No.: US 10,995,018 B2
(45) Date of Patent: May 4, 2021

(54) DEVICE FOR THE PLASMA-SUPPORTED TREATMENT OF LIQUIDS

(71) Applicant: Leibniz-Institut für Plasmaforschung und Technologie e.V., Greifswald (DE)

(72) Inventors: Klaus-Dieter Weltmann, Ostseebad Binz (DE); Ronny Brandenburg, Kessin (DE); Manfred Stieber, Greifswald (DE); Stefan Horn, Loissin (DE); Michael Schmidt, Greifswald (DE); Thomas Von Woedtke, Sundhagen (DE); Jörn Winter, Greifswald (DE)

(73) Assignee: LEIBNIZ-INSTITUT FÜR PLASMAFORSCHUNG UND TECHNOLOGIE E.V., Greifswald (DE)

( * ) Notice: Subject to any disclaimer, the term of this patent is extended or adjusted under 35 U.S.C. 154(b) by 28 days.

(21) Appl. No.: 16/391,459

(22) Filed: Apr. 23, 2019

(65) Prior Publication Data

US 2019/0322550 A1 Oct. 24, 2019

(30) Foreign Application Priority Data

Apr. 23, 2018 (EP) .................................. 18168814

(51) Int. Cl.
*C02F 1/46* (2006.01)
*C02F 1/461* (2006.01)
(Continued)

(52) U.S. Cl.
CPC .......... *C02F 1/4608* (2013.01); *C02F 1/4606* (2013.01); *C02F 1/46114* (2013.01);
(Continued)

(58) Field of Classification Search
CPC .......... C02F 1/46; C02F 1/461; C02F 1/4608; C02F 1/4606; C02F 1/46114; C02F 1/32;
(Continued)

(56) References Cited

U.S. PATENT DOCUMENTS

2014/0183054 A1* 7/2014 Legzdins ............... C02F 1/4672
205/343
2017/0362107 A1 12/2017 Oinuma et al.

FOREIGN PATENT DOCUMENTS

EP 2153851 2/2010
EP 3321233 A1 * 5/2018 ............. B01J 19/26
(Continued)

OTHER PUBLICATIONS

Ognier, S., Iya-Sou, D., Fourmond, C. and Cavadias, S., 2009. Analysis of mechanisms at the plasma—liquid interface in a gas—liquid discharge reactor used for treatment of polluted water. Plasma Chemistry and Plasma Processing, 29(4), pp. 261-273.
(Continued)

*Primary Examiner* — Cameron J Allen
(74) *Attorney, Agent, or Firm* — JMB Davis Ben-David

(57) ABSTRACT

The invention relates to a device (10) for treating a liquid with a plasma, wherein the device (10) has a high-voltage electrode (20) as well as a liquid-permeable ground electrode device (30). The ground electrode device (30) has a flat, conductive region (32) and a porous region (34) arranged on the flat, conductive region (32), wherein the conductive region (32) is liquid-permeable along its flat extension. A discharge space (40) is formed between the ground electrode device (30) and the high-voltage electrode (20). A first dielectric (50) is arranged on the high-voltage electrode (20) so that a plasma can be generated in the discharge space (40) by means of a dielectric barrier discharge. Moreover, the device (10) has an initial flow volume (60) into which the liquid (12) can be conducted, and that is
(Continued)

surrounded by a wall (62). At least in a first region, the wall (62) of the initial flow volume (60) has the ground electrode device (30) such that the initial flow volume (60) is connected to the discharge space (40) in a liquid permeable manner via the ground electrode device (30).

16 Claims, 4 Drawing Sheets

(51) Int. Cl.
  *H01J 37/32* (2006.01)
  *C02F 1/32* (2006.01)
  *C02F 1/72* (2006.01)
  *C02F 1/78* (2006.01)
(52) U.S. Cl.
  CPC .... *H01J 37/3255* (2013.01); *H01J 37/32348* (2013.01); *H01J 37/32541* (2013.01); *H01J 37/32577* (2013.01); *C02F 1/32* (2013.01); *C02F 1/722* (2013.01); *C02F 1/78* (2013.01); *C02F 2001/46133* (2013.01); *C02F 2001/46161* (2013.01); *C02F 2201/48* (2013.01); *C02F 2201/782* (2013.01); *C02F 2303/04* (2013.01); *C02F 2307/06* (2013.01); *H01J 2893/002* (2013.01)

(58) Field of Classification Search
  CPC .............. C02F 2303/04; C02F 2201/48; C02F 2201/782; C02F 2307/06; H01J 37/32; H01J 37/32348; H01J 37/32577; H01J 37/32541; H01J 37/3255; H01J 2893/002
  See application file for complete search history.

(56) References Cited

FOREIGN PATENT DOCUMENTS

| | | | | |
|---|---|---|---|---|
| JP | 2002 126769 | 5/2002 | | |
| JP | 2012 227149 | 11/2012 | | |
| KR | 2012 0097138 | 9/2012 | | |
| RU | 2637026 C1 | * | 11/2017 | ............ C02F 1/4608 |
| WO | WO-9842624 A1 | * | 10/1998 | ................ C02F 1/32 |
| WO | 2006116828 | 11/2006 | | |

OTHER PUBLICATIONS

Bubnov, A.G., Burova, E.Y., Grinevich, V.I., Rybkin, V.V., Kim, J.K. and Choi, H.S., 2006. Plasma-catalytic decomposition of phenols in atmospheric pressure dielectric barrier discharge. Plasma Chemistry and Plasma Processing, 26(1), pp. 19-30.

* cited by examiner

DEVICE FOR THE PLASMA-SUPPORTED TREATMENT OF LIQUIDS

CROSS-REFERENCE TO RELATED APPLICATIONS

Benefit is claimed to European Patent Application No. 18168814.4 filed Apr. 23, 2018, the contents of which are incorporated by reference herein in their entirety.

FIELD

The invention relates to a device for the plasma treatment of liquids and liquid films.

BACKGROUND

Devices and methods for treating surfaces using low-temperature plasmas under conditions of atmospheric pressure have been established for many years for a variety of industrial applications.

In the meantime, new possible applications of atmospheric pressure plasmas have also gained entry in some areas of biology and medicine which has led, for example, to "plasma medicine" developing internationally into a new independent field. Interactions between atmospheric pressure plasmas and liquids play a significant role both in plasma medicine and in drinking water and wastewater processing, which is therefore being investigated in numerous scientific studies from different perspectives. An overview of such investigations is offered in the scientific professional article, "Plasma—liquid interactions: a review and roadmap" (Bruggeman P J, Kushner M J, Locke B R, et al., Plasma science and technology 2016 25 053002).

Moreover, arrangements and methods for plasma-treating liquids are described in the professional and patent literature which are based on the use of various types of plasma sources.

An overview of solutions known from the prior art are provided by the professional article, "Electrical discharge in water treatment technology for micropollutant decomposition" (Vanraes P, Nikiforov A, Leys C, Plasma science and technology: progress in physical states and chemical reactions 2016, 457).

In the aforementioned survey articles, devices, among other things, are described that are designed in the form of a so-called "waterfall reactor", or respectively "water film reactor".

In principle, these devices are vertical, coaxial arrangements for generating a dielectric barrier discharge (DBD), wherein the water to be treated with the plasma is guided over the surface of one of the two concentrically arranged electrodes in the discharge space so that the reactive species that is formed in the plasma that is generated above the water film surface can act directly on the water film.

Different embodiments of this type of a device for treating a liquid basically result from different electrode arrangements, as well as from the arrangement of the water film to be treated.

This type of "water film reactor" was primarily designed for breaking down pollutants in water that are difficult to break down using conventional methods.

In order to be able to achieve an effective breakdown of pollutants, the water to be treated must generally be guided repeatedly through the "water-film reactor".

A plasma reactor of this type is for example described in the professional article by B. P. Dojčinović and coll. (Dojčinović B P et al., "Decolorization of reactive textile dyes using water falling film dielectric barrier discharge", Journal of Hazardous Materials 192 2011763).

Due to the basic design of these reactors described therein and their handling, they are only slightly useful for disinfecting tap water directly after the outlet tap of a water line. Moreover, these reactors are unsuitable for generating plasma-treated water for effectively disinfecting surfaces.

With the device according to the invention, these envisioned applications and goals are achieved, or respectively the conditions therefor are significantly improved.

SUMMARY

The object of the present invention is to provide a device for treating a liquid, in particular water, having a plasma that enables plasma treatment of a liquid in a space-saving and effective manner.

The problem is solved by the device for treating a liquid with a plasma according to claim 1. Advantageous embodiments of the device are cited in the dependent claims. A system for treating a liquid with a plasma is presented in claim 15. These and other embodiments will be described in the following.

BRIEF DESCRIPTION OF THE FIGURES

Additional features and advantages of the invention will be explained below with reference to the description of figures of exemplary embodiments. In the figures.

DETAILED DESCRIPTION

Figure 1:
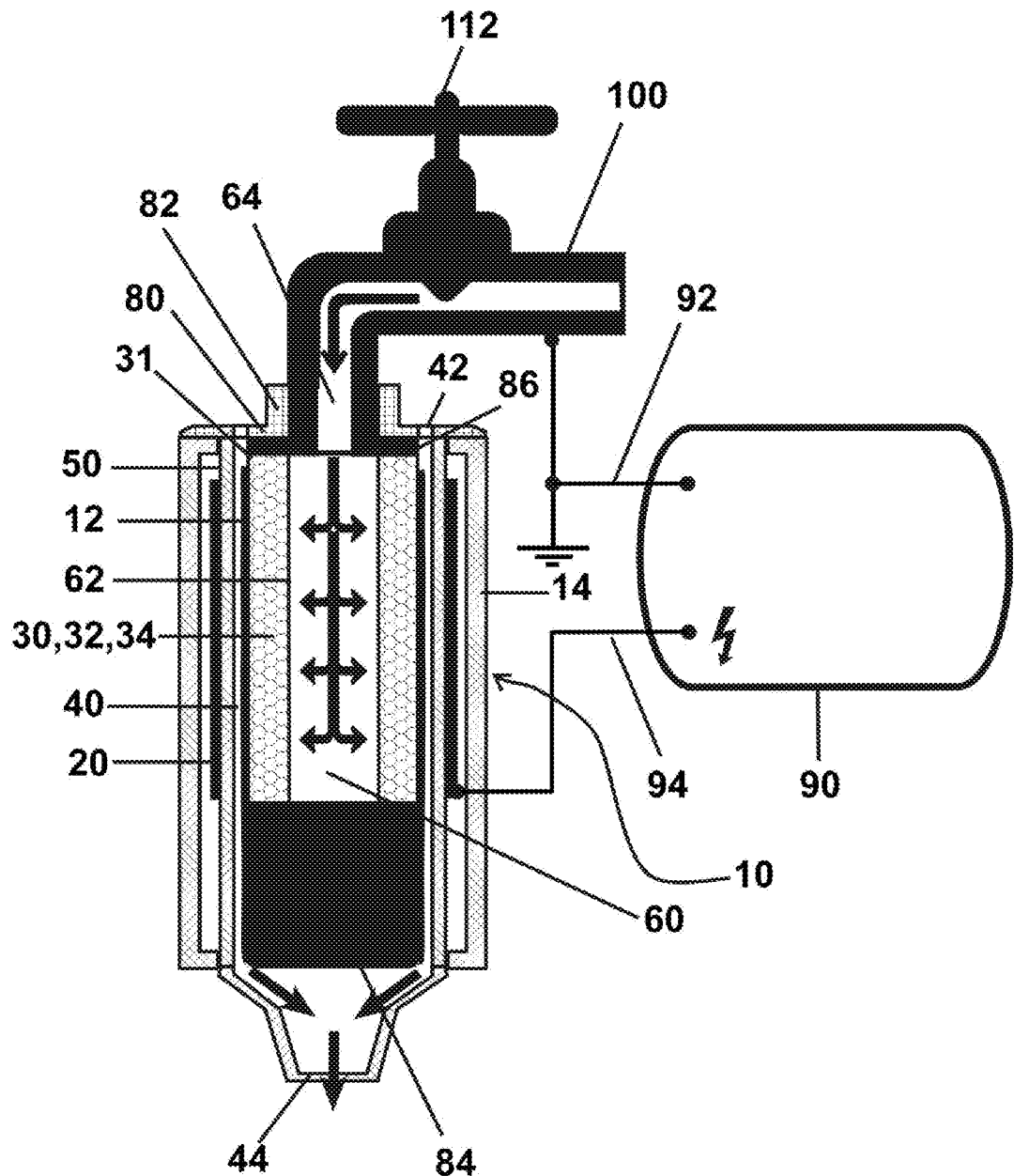
FIG. 1 shows a sectional view of a vertical embodiment of the device that is connected to a water tap.

A first element of the invention relates to a device for treating a liquid with a plasma, wherein the device has a high-voltage electrode as well as a liquid-permeable ground electrode device. The ground electrode device comprises a flat, conductive region and a porous region adjacent to the flat, conductive region, wherein the conductive region is liquid-permeable along its flat extension.

Between the ground electrode device and the high-voltage electrode, a discharge space is formed in which a plasma can be generated for treating the liquid.

To generate a non-thermal plasma under atmospheric pressure by means of a dielectric barrier discharge, an insulator (dielectric) functioning as a dielectric barrier is arranged, in particular flat, in the discharge space at least on the high-voltage electrode i.e., the first dielectric.

This means in particular that the at least one region of the first dielectric is in contact with the high-voltage electrode. The first dielectric is in particular positioned relative to the high-voltage electrode such that the first dielectric is arranged between the high-voltage electrode and the ground electrode device, in particular the conductive region of the ground electrode device. The porous region of the ground electrode device can be dielectric so that the porous region can function as the dielectric.

In addition, the ground electrode device can have a second dielectric, and/or be arranged on a second dielectric. It is provided in particular that the porous region of the ground electrode device can be dielectric so that the porous region can function as the second dielectric. In the embodiment in which a second dielectric is arranged on the ground electrode device, it is necessary for the second dielectric to be liquid-permeable.

Moreover, the device according to the invention has an initial flow volume into which the liquid can be introduced, for example, via a liquid regulator such as a water tap. The initial flow volume is enclosed by a wall.

At least in a first region, the wall of the initial flow volume has the ground electrode device such that the initial flow volume is connected to the discharge space in a liquid permeable manner via the ground electrode device.

In particular, the high-voltage electrode, the first dielectric and the conductive region of the ground electrode device are designed flat and arranged opposite the discharge space such that the device is in particular suitable for generating a so-called volume dielectric barrier discharge (volume DBD).

In particular, the device according to the invention is designed such that the liquid from the initial flow volume can only pass through the ground electrode device into the discharge space, i.e., there is in particular no other liquid-permeable connection between the discharge space and the initial flow volume. This generates a particularly homogeneous liquid film that can be effectively treated by the plasma generated in the discharge space.

When the device is operating, the liquid introduced into the initial flow volume passes through the ground electrode device and flows over a surface of the ground electrode device that is facing the discharge space. A liquid film forms on this surface on which the plasma can act extensively.

The initial flow volume has in particular an infeed through which the liquid can be fed to the initial flow volume.

The device can be connected both to a water tap as well as to a liquid tank via the infeed. This enables another area of use of the invention in particular in private households where the device according to the invention is suitable for purifying and disinfecting tap water. Likewise, water from a tank can be treated with the assistance of the device according to the invention.

The water can already undergo plasma treatment in the tank before it is fed to the device according to the invention. In particular a version is proposed for plasma treatment in a tank that is known as the "version with discharges at the water surfaces".

A plasma is understood in particular to mean a gas with a portion of free electrons, radicals, ions and neutral particles. When using the environmental air as the process gas in the plasma for dielectric barrier discharge, in particular reactive oxygen species also known as ROS such as ($O_3$), hydrogen peroxide ($H_2O_2$), hyperoxide anion ($O_2.^-$), highly reactive hydroxyl radical (OH.), as well as reactive nitrogen species also known as RNS such as nitrogen dioxide ($NO_2$.), nitrogen oxide (NO.) and peroxynitrite ($ONOO^-$) are generated. These react with the water film where they cause the formation, or respectively the addition of reactive oxygen and nitrogen species, and accordingly the envisioned effects of the plasma treatment of water, i.e., purifying and disinfection.

Moreover, the reactive species have an antimicrobial effect which disinfects the water.

Since the plasma-treated water still has a portion of reactive species after the plasma treatment, the plasma-treated water can be used to disinfect surfaces, for hand disinfection, or to disinfect fruit and vegetables.

The reactive oxygen and nitrogen species generated, or respectively introduced into water by the plasma treatment have a positive effect on plant growth due to synergistic effects so that the treated water can be used to optimize growth processes and to increase the yield in gardening and agriculture.

The device according to the invention enables particularly effective treatment of liquid since the device according to the invention is designed to generate a thin liquid film with a comparatively large surface on the ground electrode device that is exposed to the plasma generated in the discharge space over the entire extent of this surface.

In contrast to "water-film reactors" from the prior art, the water to the treated is in particular not guided directly as a water film over the surface of the electrodes in the device according to the invention, but rather is guided through the ground electrode device into the discharge space on its surface.

This causes in particular an even formation of the water film on the ground electrode device. Moreover, the water is in particular filtered through the porous region of the ground electrode device.

In so doing, the entire passage surface of the porous region of the ground electrode device for the liquid is comparatively large relative to solutions from the prior art that only have a few connecting openings to a discharge space.

The porous region designates a porous, permeable region, in particular a region that has a plurality of small holes, channels and/or capillaries.

According to one embodiment of the invention, the ground electrode device is designed and positioned such that the conductive region is arranged at least on a side of the wall facing the initial flow volume, and the porous region is arranged at least on a side facing the discharge space.

The porous region of the ground electrode device has for example an insulating material, wherein the porous region consists in particular of an insulating material such as ceramic material so that the device has two dielectrics, i.e., the first and the second dielectric, between which the discharge space is formed.

The use of a ground electrode device that has a porous ceramic region which can function as a second dielectric has the advantage that a more homogeneous, less thick filamentary plasma can form in the discharge space in comparison to an embodiment without the second dielectric, and a more even treatment of the water film is thereby enabled.

Alternatively, the structure of the porous region can basically have only unbranched channels or capillaries that penetrate the porous region and extend between the initial flow volume and the discharge space.

According to another embodiment of the invention, the discharge space has at least one outlet opening for liquid through which the liquid can be discharged from the device after treatment with the plasma.

According to one embodiment of the invention, the ground electrode device has at least three channels that connect the discharge space and the initial flow volume to each other in a manner permeable to fluid.

Another embodiment of the invention provides that the flat, conductive region of the ground electrode device has a plurality of apertures which border the porous region.

An aperture is for example a hole.

In particular it is provided according to the invention that the flat, conductive region of the ground electrode device has more than two apertures, wherein each aperture penetrates the conductive region from the side facing the initial flow volume to the side bordering the porous region.

Another embodiment of the invention provides that the flat, conductive region of the ground electrode device has a perforated, or a grid-like, or a textile structure, or a porous structure.

A grid-like structure is in particular a regular or a semi-regular grid structure.

A textile structure has in particular fibers which are joined to form a fabric, for example by spinning or weaving. According to the invention, the textile structure comprises in particular conductive fibers.

In particular, the flat, conductive region of the ground electrode device has an electrically conductive textile, or consists of an electrically conductive textile.

According to one embodiment of the invention, the flat, conductive region of the ground electrode device has a conductive gauze, in particular a metal gauze, or consists of the gauze.

In particular, conductive textiles as well as conductive gauzes can be easily brought into the necessary shape for the ground electrode device, for example by bending, so that easy and affordable production of the ground electrode device is possible.

Another embodiment of the invention provides that the porous region of the ground electrode device is conductive, and is conductively connected to the conductive region, or is formed integrally with the conductive region.

Whereas the porous region of the ground electrode device does not generally have to be designed conductive, this is however explicitly provided according to this embodiment.

One version of the above embodiment accordingly provides that the porous region and the conductive region are integrally formed. This means that in this embodiment, the porous region and the conductive region are formed as a single piece from the same material.

It is alternatively provided that the conductive region and the porous region consist of two different parts that however are conductively joined to each other.

According to another embodiment of the invention, the porous region of the ground electrode device has an insulating material, in particular a second dielectric, in particular a crystalline, partially crystalline or a ceramic material. In an alternative embodiment, the porous region of the ground electrode device consists of such a material.

According to the invention, it is accordingly provided that the conductive region for example is arranged on a ceramic region, or is surrounded by the ceramic region.

A crystalline material has a regular structure. A partially crystalline material comprises crystalline and amorphous regions. No regular structure is formed in an amorphous region. A ceramic material is crystalline, in particular polycrystalline. This means that it has a plurality of individual crystals.

According to another embodiment of the invention, the device is configured such that the porous region is formed as a liquid filter such that a liquid passing through the porous region is filtered.

In particular, the liquid filter can filter out solid particles such as microplastics from the liquid. The device according to the invention therefore enables an additional treatment step of the liquid that precedes the plasma treatment of the liquid.

Depending on the pore size of the porous region, exclusively larger or smaller particles as well are filtered out of the liquid. In particular, pores with a diameter between 100 nm and 1000 nm are according to the invention. However, the invention is not limited to pores of this diameter.

According to another embodiment of the invention, the wall is formed rotationally symmetrical or axially symmetrical along a direction of extension of the initial flow volume.

Another embodiment of the invention provides that the wall of the initial flow volume is formed cylindrical or conical, in particular wherein the wall in a surrounding region of this cylinder jacket or the cone consists of the ground electrode device.

The conical shape comprises both the shape of a cone as well as the shape of a conical frustum, or similar tapering or widening shape contours.

The basic surface of the cylinder or the cone is in particular circular or elliptical. The invention comprises in particular straight cylinders or straight cones, but is not limited thereto.

Another embodiment of the invention provides that the ground electrode device and the high-voltage electrode are arranged coaxially.

According to this embodiment of the invention, the high-voltage electrode is in particular arranged to radially and parallelly surround the ground electrode device, or opposite in regions.

The discharge space that lies between the high-voltage electrode and the ground electrode device is accordingly also arranged coaxially just like the first dielectric.

The initial flow volume according to this embodiment is arranged in the interior of the ground electrode device. The common axis of the coaxially arranged components runs through the initial flow volume.

To the outside, the high-voltage electrode is in particular surrounded by an insulator that for example is formed by an acrylic pipe.

In an alternative coaxial embodiment, the ground electrode device is in particular arranged to radially and parallelly surround the high-voltage electrode, or opposite in regions.

In this coaxial version, the common axis of the coaxial components runs through the high-voltage electrode.

According to this embodiment, the initial flow volume surrounds the ground electrode device from the outside according to the invention.

The coaxial embodiment of the invention can be fed a liquid in the initial flow volume. The liquid passes through the ground electrode device into the discharge space and forms a liquid film on the side of the ground electrode device in the discharge space facing away from the initial flow volume which flows off of the surface of the ground electrode device and can be exposed to the plasma.

Alternatively, the device can be arranged such that the liquid is fed to the initial flow volume from below.

The coaxial design of the device according to the invention enables a compact, i.e., space-saving design.

The coaxial embodiments can for example be arranged on a water tap for water purification.

When the coaxial embodiments are in a proper state, it is in particular provided that the ground electrode device and the high-voltage electrode run coaxially along a vertical direction of extension of the device.

According to an alternative, non-coaxial embodiment of the invention, the ground electrode device is arranged on a flat region of the wall, wherein the ground electrode device is designed flat.

According to the invention, the high-voltage electrode is arranged substantially plane-parallel to the ground electrode device. In particular, the high-voltage electrode is positioned above the ground electrode device.

In this case, the liquid from the initial flow volume is pressed upward by the ground electrode device into the discharge space. There it forms the liquid film which is exposed to the plasma.

The operation of the device according to this embodiment is not bound to a vertical installation position. In this embodiment according to the invention, operation in a horizontal installation position is also possible.

Another embodiment of the invention provides that the device has a process gas opening through which a gaseous medium can be guided into the discharge space. In this context, the process gas opening has in particular a connection at which a gas source can be connected to the device.

The process gas opening is arranged such that it directly connects the discharge space to the gas source. A process gas can be introduced directly into the discharge space through the process gas opening.

Alternatively, this process gas opening is in particular arranged such that the process gas is introduced into the region of the ground electrode device. The process gas enters the discharge space through the ground electrode device.

The process gas can for example be environmental air or a plasma gas generated by a thermal plasma source.

Advantageously, this embodiment according to the invention enables a gas—in addition to a liquid to be treated—to be guided through the porous electrode or directly into the discharge space.

For example, the plasma gas is thereby introduced into the device from another atmospheric pressure plasma source with a thermal or a nonthermal plasma.

In particular in thermal plasma sources such as in a DC plasma jet arrangement (DC: direct-current), a gas mixture is generated with a high concentration of reactive nitrogen species.

Introducing such a plasma gas into the discharge space of the device according to the invention enables the introduction of nitrogen compounds into the liquid to be treated.

Water that has been treated in this manner can be used to optimize growth processes, and to increase yield in gardening and in agriculture.

According to one embodiment of the invention, the device has an ultraviolet radiation source (UV radiation source), or a connecting means for a UV radiation source, wherein the UV radiation source is positioned, or is positionable by the connecting means, such that the UV radiation contacts the liquid. In particular, it is provided that the UV radiation contacts the liquid after the liquid has been treated by the plasma.

In particular, the UV radiation source transmits electromagnetic radiation within a wavelength range of 100 nm to 400 nm.

Shortwave UV radiation within a range of so-called UV-C radiation defined as radiation with a wavelength of 100 nm to 280 nm can be used to sterilize drinking water since it has an antimicrobial effect, in particular within a wavelength range of about 240 nm to 270 nm.

The embodiment according to the invention enables a coupled treatment of a liquid by a plasma and by means of UV radiation. This enables increased effectiveness of the treatment of the liquid.

According to one embodiment of the invention, at least one outlet opening from the discharge space from which the liquid can leave the device is designed as a spray nozzle or as a nozzle pipe, or has a means with which the device can be connected to a spray nozzle or a nozzle pipe.

The outlet opening designed as a nozzle pipe enables the treatment of large areas with the plasma-treated liquid. This option has advantages in particular for applications in gardening and in agriculture.

The nozzle pipe can also be equipped with spray nozzles for this purpose so that the plasma-treated water is applied to large areas under pressure in the form of a spray fog.

Another element of the invention provides that a system has at least one first and one second device for treating a liquid, wherein the first device is arranged in a series with the second device.

For a series connection, the first device is connected to the second device by an outlet opening in the first device, and an infeed opening in the second device.

In FIG. 1, the design of the device 10 according to the invention for treating a liquid with a plasma is shown in a cutaway view. The device 10 is mounted on a water tap 100 by means of a connecting segment 82 that is formed by a mounting plate 80. The mounting plate 80 forms the top end of the device 10 and extends beyond its overall top side.

The device 10 shown in FIG. 1 comprises a cylindrically shaped initial flow volume 60 into which a liquid 12 can be introduced from the water tap 100 through an infeed 64. The initial flow volume 60 is bordered by a tube-shaped ground electrode device 30, i.e., the wall 62 of the initial flow volume 60 is formed entirely by the ground electrode device 30. The ground electrode device 30 is fine-pored and liquid-permeable. The ground electrode device 30 is designed as a single part, i.e., the conductive region 32 and the porous region 34 consist of the same material. The discharge space 40 extends in a coaxial arrangement around the ground electrode device 30 and is bordered on its side facing away from the ground electrode device 30 by a first dielectric 50. The first dielectric 50 is for example a glass pipe or a quartz glass pipe.

A high-voltage electrode 20 is arranged on the side of the first dielectric 50 facing away from the discharge space 40. The high-voltage electrode 20 is designed tubular and coaxial to the ground electrode device 30, i.e., the high-voltage electrode 20 and the ground electrode device 30 run parallel lying opposite each other. The discharge space 40 extends between them. Radially toward the outside, the high-voltage electrode 20 is surrounded by a housing 14. The housing 14 protects the device 10 from contact from the outside.

Due to the electrode geometries, the device 10 can generate a plasma in the discharge space 40.

The ground electrode device 30 is connected and grounded by a first connecting cable 92 to a high voltage source 90. Likewise, the high-voltage electrode 20 is connected by a second connecting cable 94 to the high-voltage source 90 such that after the high-voltage source 90 is turned on, a voltage applied between the electrodes 20, 30 causes the triggering of a volume dielectric barrier discharge in the discharge space 40.

In the region of the mounting plate 80 that borders the discharge space 40 at the top, there are process gas openings 42 through which a process gas can be introduced into the discharge space 40. The liquid 12 passes out of the bottom region of the discharge space 40 through an outlet opening 44 out of the device 10.

The bottom end of the initial flow volume 60 and the ground electrode device 30 is bordered by an end piece 84 consisting of a solid material that the liquid 12 cannot penetrate. The top end of the ground electrode device 30 is bordered by a cover ring 86 consisting of solid material. The mounting plate 80 is arranged above the cover ring 86.

Figure 2:
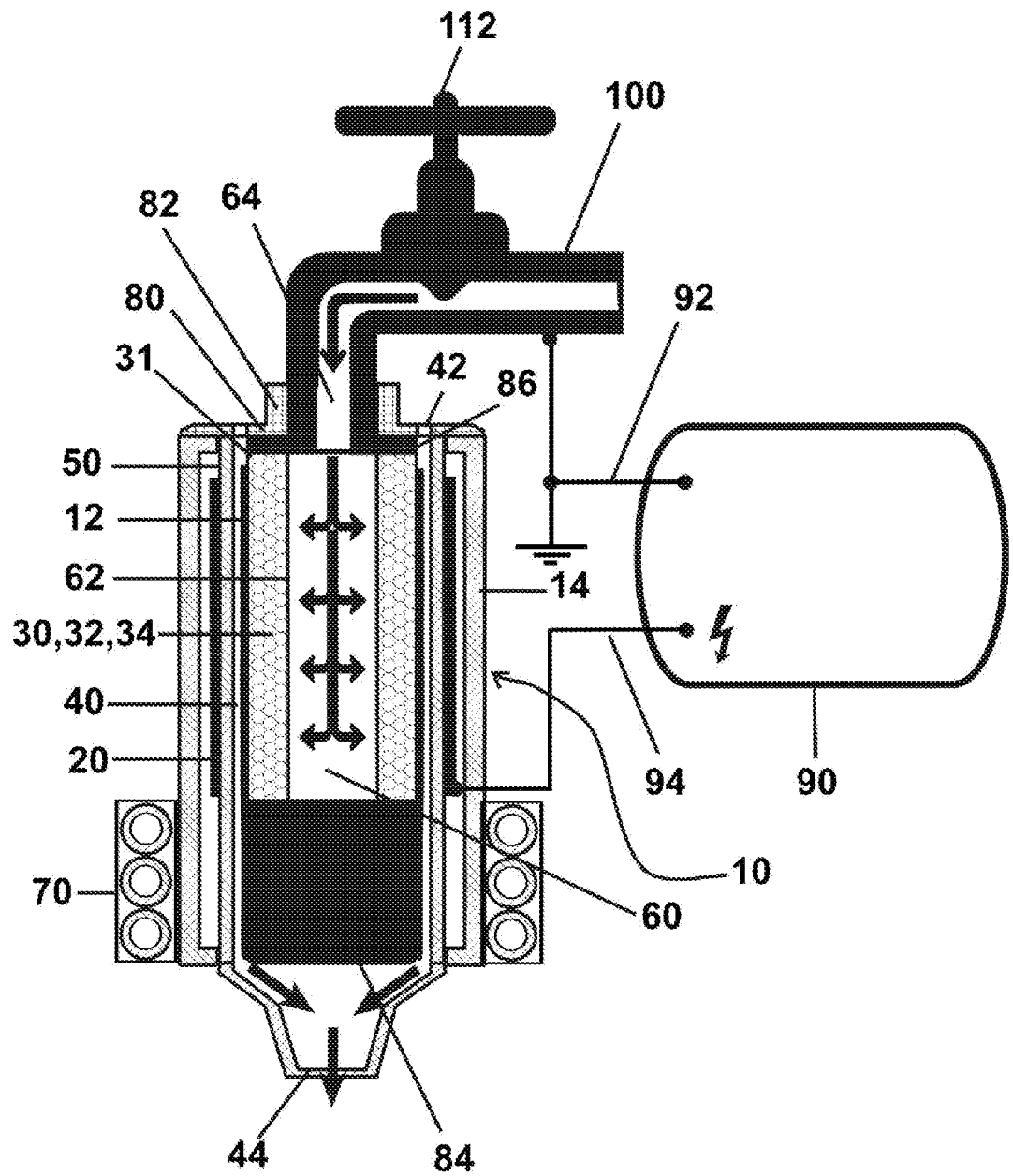
FIG. 2 shows a sectional view of a vertical embodiment of the device that comprises UV radiation sources and that is connected to a water tap.

FIG. 2 shows the device 10 according to the invention for treating a liquid with a plasma that has a UV radiation source 70 in a cutaway view. The device 10 shown in FIG. 2 is similar to the device 10 that is shown in FIG. 1 in that the device 10 in FIG. 2 is also designed coaxial and is arranged in a vertical alignment. The initial flow volume 60 that is bordered by the ground electrode device 30 is located inside. The outer surface 31 of the ground electrode device 30 borders the discharge space 40 which is surrounded by the first dielectric 50. The first dielectric 50 is surrounded by the high-voltage electrode 20, and this is surrounded by the housing 14. In addition to the components already shown in FIG. 1, the device 10 shown in FIG. 2 comprises a UV radiation source 70. The UV radiation source 70 is arranged radially to the outside of the housing 14 on the device 10. It is arranged in the region in which the end piece 84 consisting of solid material is positioned in the interior of the device 10. This means that the UV radiation source 70 is arranged below the ground electrode device 30 and the high-voltage electrode 20. In this embodiment of the device 10, it is provided that the housing 14, at least in one region that borders the UV radiation source 70, consists of quartz glass. This embodiment makes it possible for the shortwave UV radiation to not be absorbed by the material of the housing 14. The effect of the UV radiation on the liquid 12 is thereby retained.

In an alternative embodiment, it is provided that the device 10, is designed such that the UV radiation source 70 is integrated in a region of the housing 14. In a straightforward manner, this prevents the UV radiation from being absorbed by the material of the housing 14.

Figure 3:
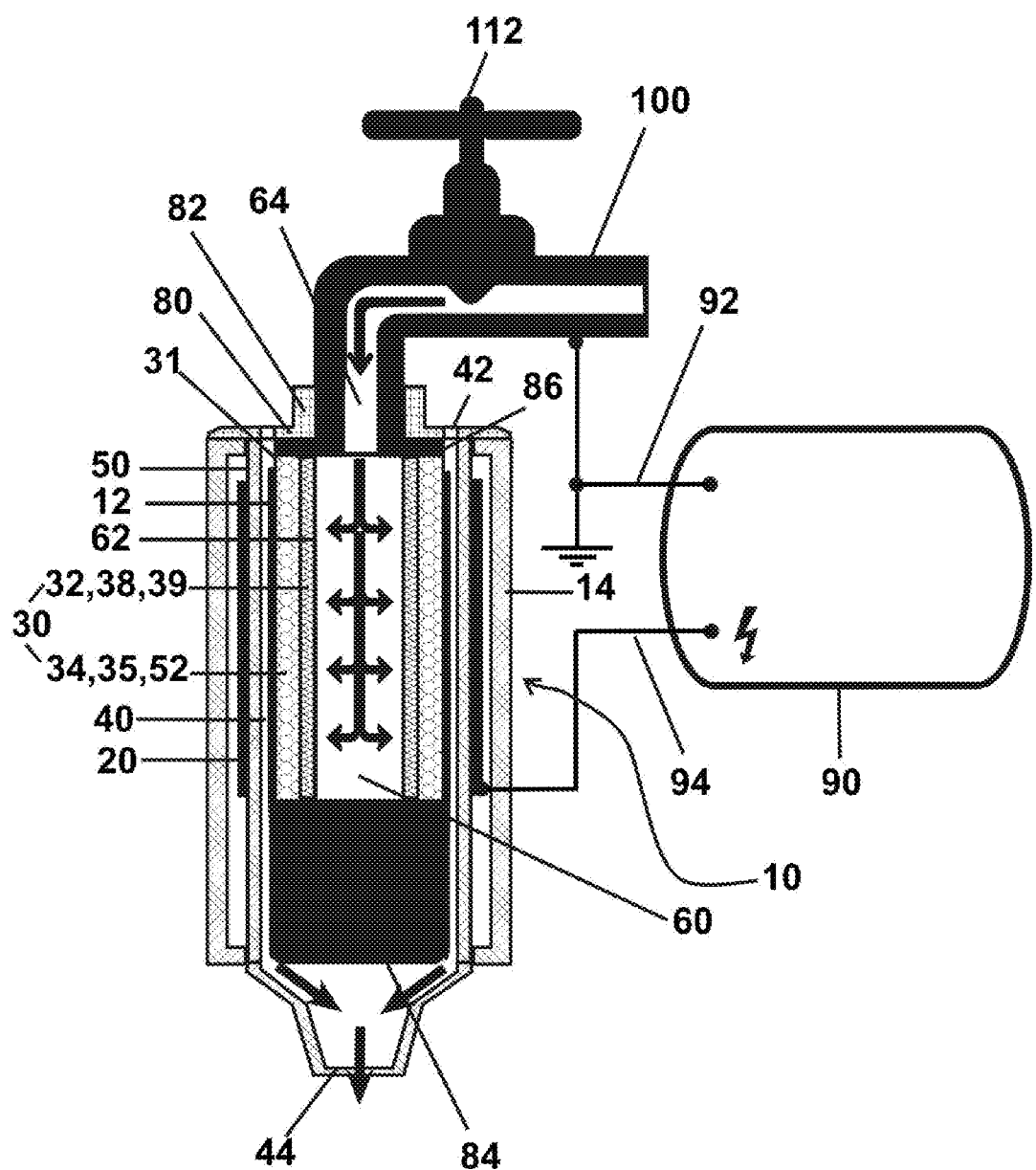
FIG. 3 shows a sectional view of a vertical embodiment of the device in which the ground electrode device comprises a metal fabric and a ceramic pipe and that is connected to a water tap.

The embodiment of the device 10 shown as a cutaway in FIG. 3 is also designed coaxial.

Centrally, the device 10 has the initial flow volume 60. The ground electrode device 30 borders the initial flow volume 60 and comprises a conductive region 32 and a porous region 34. The conductive region 32 is formed by a liquid-permeable metal fabric that for example is a conductive textile 39 or metal gauze 38. The metal fabric is surrounded by the porous region 34 that for example is formed by a ceramic pipe 35. The ceramic pipe 35 is porous and hence also liquid-permeable. The ceramic pipe 35 is electrically nonconductive and serves as a second dielectric 52. The ceramic pipe 35 borders the discharge space 40 at the side facing away from the initial flow volume 60 which, on its other side, is bordered by the first dielectric 50 formed by the glass pipe. A metal fabric forms the high-voltage electrode 20 bordering the first dielectric 50 radially to the outside. An acrylic pipe forms the housing 14 that is positioned radially to the outside of the high-voltage electrode 20.

The top ends of the mass electrode device 30 and the first dielectric 50 are positioned in the mounting plate 80. As already shown in FIG. 1, the bottom end of the initial flow volume 60 and the ground electrode device 30 is always bordered by an end piece 84 consisting of a solid material that the liquid 12 cannot penetrate. The liquid 12 can pass out of the device 10 from the bottom region of the discharge space 40 through an outlet opening 44.

Figure 4:
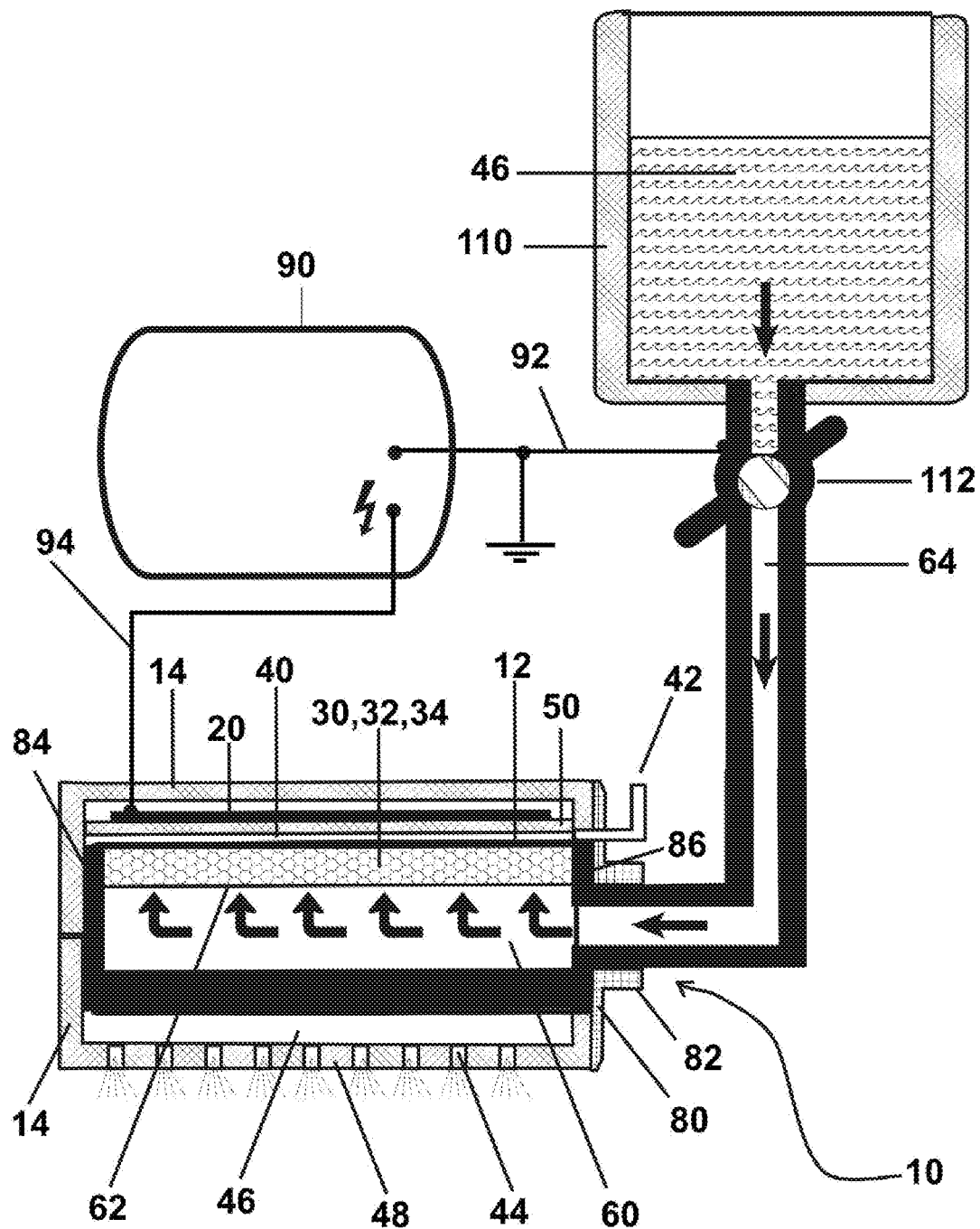
FIG. 4 shows a sectional view of a horizontal embodiment of the device that is connected to a water tank.

FIG. 4 shows a cutaway view of an embodiment of the device 10 in which the ground electrode device 30 is designed flat. The ground electrode device 30 is formed as a single part. The device 10 is arranged horizontally. The connection segment 82 through which the liquid 12 passes out of a liquid tank 110 into the initial flow volume 60 is positioned laterally. The connection segment 82 is formed by the mounting plate 80 that extends over an entire side surface of the device 10. The inflow of the liquid from the liquid tank 110 into the initial flow volume 60 is regulated by means of a discharge valve 112.

The bottom region as well as the lateral region of the initial flow volume 60 that is opposite the connection segment 82 are bordered by end pieces 84 consisting of solid material. The region around the connection segment 82 is also bordered by solid material. The top region of the initial flow volume 60 is bordered by the ground electrode device 30 that extends flat. The ground electrode device 30 is designed fine-pored and liquid-permeable. Located above the ground electrode device 30 is the discharge space 40 whose top limit is formed by a first dielectric 50. The high-voltage electrode 20 is positioned on the side of the first dielectric 50 facing away from the discharge space 40. A region of the housing 14 is arranged above the high-voltage electrode 20. The housing 14 also forms a bottom limit of the device 10. A collection volume 46 extends between the bottom region of the housing 14 and the bottom region of the initial flow volume 60. The bottom region of the discharge space 40 ends in the collection volume 46. The bottom region of the housing 14 comprises exit openings 44 that are designed as spray nozzles 48. The liquid 12 exits through them out of the collection volume 46.

A process gas opening 42 is located in the region of the mounting plate 80 that borders the discharge space 40 on the side and at which the connection segment 82 is formed. A process gas can pass through this into the discharge space 40. A process gas can for example be ambient air.

The ground electrode device 30 is connected and grounded by a first connecting cable 92 to the high voltage source 90. The high-voltage electrode 20 is connected by a second connecting cable 94 to the high voltage source 90. After the high voltage source 90 is switched on, the voltage applied to the electrodes 20, 30 causes a dielectric barrier discharge to trigger in the discharge space 40, in particular a volume dielectric barrier discharge.

LIST OF REFERENCE NUMBERS

10 Device
12 Liquid
14 Housing
20 High-voltage electrode
30 Ground electrode device
31 Outer surface
32 Conductive region
34 Porous region
35 Ceramic pipe
38 Metal gauze
39 Conductive textile
40 Discharge space
42 Process gas opening
44 Outlet opening
46 Collection volume
48 Spray nozzle
50 First dielectric
52 Second dielectric
60 Initial flow volume
62 Wall
64 Infeed
70 UV radiation source
80 Mounting plate
82 Connection segment 84 End piece
86 Cover ring
90 High voltage source
92 First connection cable
94 Second connection cable
100 Water tap
110 Liquid tank
112 Discharge valve

We claim:

1. A device (10) for treating a liquid (12) with a nonthermal atmospheric pressure plasma, wherein the device (10) has the following components:
   a high-voltage electrode (20);
   a liquid-permeable ground electrode device (30) that has a flat, conductive region (32) and a porous region (34) arranged on the flat, conductive region (32), wherein the conductive region (32) is liquid-permeable along its flat extension;
   a discharge space (40) formed between the ground electrode device (30) and the high-voltage electrode (20);
   a first dielectric (50) that is arranged on the high-voltage electrode (20) so that a plasma can be generated in the discharge space (40) by means of a dielectric barrier discharge;
   an initial flow volume (60) surrounded by a wall (62) into which the liquid (12) can be introduced;
   characterized in that
   at least in a first region, the wall (62) of the initial flow volume (60) comprises the ground electrode device (30) such that the initial flow volume (60) is connected to the discharge space (40) in a liquid permeable manner via the ground electrode device (30) and wherein the liquid introduced into the initial flow volume (60) passes through the ground electrode device (30) and flows over a surface of the ground electrode device (30) that faces the discharge space (40).

2. The device (10) according to claim 1, characterized in that the flat, conductive region (32) of the ground electrode device (30) has a plurality of apertures which border the porous region (34).

3. The device (10) according to claim 1, characterized in that the flat, conductive region (32) of the ground electrode device (30) has a perforated, or a grid-like, or a textile structure, or a porous structure.

4. The device (10) according to claim 1, characterized in that the flat, conductive region (32) of the ground electrode device (30) has electrically conductive textile (39), or consists of an electrically conductive textile (39).

5. The device (10) according to claim 1, characterized in that the flat, conductive region (32) of the ground electrode device (30) has a conductive gauze (38) or consists of the gauze.

6. The device (10) according to claim 1, characterized in that the porous region (34) of the ground electrode device (30) is conductive, and is at least conductively connected to or is formed integrally with the conductive region (32).

7. The device (10) according to claim 1, characterized in that the porous region (34) of the ground electrode device (30) has or consists of an insulating material (52), in particular a second dielectric (52), in particular a crystalline, partially crystalline or a ceramic material.

8. The device (10) according to claim 1, characterized in that the porous region (34) is formed as a liquid filter such that a liquid (12) passing through the porous region (34) is filtered.

9. The device (10) according to claim 1, characterized in that the wall (62) of the initial flow volume (60) is formed cylindrical or conical, in particular wherein the wall (62) in a surrounding region of this cylinder jacket or the cone consists of the ground electrode device (30).

10. The device (10) according to claim 1, characterized in that the ground electrode device (30) and the high-voltage electrode (20) are arranged coaxially.

11. The device (10) according to claim 1, characterized in that the ground electrode device (30) is arranged on a flat region of the wall (62), wherein the ground electrode device (30) is designed flat.

12. The device (10) according to claim 1, characterized in that the device (10) has a process gas opening (42) through which a gaseous medium can be guided into the discharge space (40).

13. The device (10) according to claim 1, characterized in that the device (10) has a UV radiation source (70), or a connecting means for a UV radiation source (70), wherein the UV radiation source (70) is positioned, or is positionable by the connecting means, such that the UV radiation contacts the liquid (12).

14. The device (10) according to claim 1, characterized in that the device (10) has at least one outlet opening (44) in the discharge space (40) from which the liquid (12) can exit from the device (10), wherein the at least one outlet opening (44) is designed as a spray nozzle (48) or as a nozzle pipe or has a means with which the device (10) can be connected to a spray nozzle or a nozzle pipe.

15. A system for treating a liquid with a plasma, characterized in that the system has at least one first and one second device (10) for treating a liquid (12) according to claim 1, wherein the first device (10) is arranged in a series with the second device (10).

16. The device according to claim 1, wherein during operation of the device a liquid film is formed on the surface of the ground electrode device (30) that faces the discharge space (40) and the plasma acts extensively on the liquid film.

* * * * *